United States Patent
Leung et al.

(10) Patent No.: US 9,318,362 B2
(45) Date of Patent: Apr. 19, 2016

(54) DIE BONDER AND A METHOD OF CLEANING A BOND COLLET

(71) Applicants: Mei Po Leung, Kwai Chung (HK); Wing Yin Lee, Kwai Chung (HK); Chi Ming Chong, Kwai Chung (HK)

(72) Inventors: Mei Po Leung, Kwai Chung (HK); Wing Yin Lee, Kwai Chung (HK); Chi Ming Chong, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 14/578,695

(22) Filed: Dec. 22, 2014

(65) Prior Publication Data
US 2015/0187617 A1   Jul. 2, 2015

Related U.S. Application Data

(60) Provisional application No. 61/921,178, filed on Dec. 27, 2013.

(51) Int. Cl.
  B23K 37/00    (2006.01)
  H01L 21/67    (2006.01)
  B23K 3/02     (2006.01)

(52) U.S. Cl.
  CPC .......... *H01L 21/67144* (2013.01); *B23K 3/028* (2013.01); *B23K 3/029* (2013.01); *H01L 21/6704* (2013.01)

(58) Field of Classification Search
  None
  See application file for complete search history.

(56) References Cited

U.S. PATENT DOCUMENTS

| | | | | |
|---|---|---|---|---|
| 2,365,022 A | * | 12/1944 | Sturtevant | 15/210.1 |
| 2,898,620 A | * | 8/1959 | Dickinson | 15/160 |
| 4,176,778 A | * | 12/1979 | Fortune | 228/57 |
| 5,259,155 A | * | 11/1993 | Ishida et al. | 451/65 |
| 5,961,728 A | * | 10/1999 | Kiser et al. | 134/1 |
| 6,130,104 A | * | 10/2000 | Yamasaka | 438/14 |
| 6,744,003 B1 | * | 6/2004 | Ono | 219/85.16 |
| 7,641,739 B2 | * | 1/2010 | Matlack et al. | 134/6 |
| 7,727,337 B2 | * | 6/2010 | Sachdev et al. | 134/27 |
| 7,866,530 B1 | * | 1/2011 | Riachentsev | 228/51 |
| 2001/0015372 A1 | * | 8/2001 | Yamamoto et al. | 228/180.22 |
| 2002/0011313 A1 | * | 1/2002 | Sugiura et al. | 156/536 |
| 2002/0042960 A1 | * | 4/2002 | Hayashi | 15/93.1 |
| 2002/0096187 A1 | * | 7/2002 | Kuwata et al. | 134/1 |
| 2003/0200989 A1 | * | 10/2003 | Humphrey et al. | 134/2 |
| 2004/0038499 A1 | * | 2/2004 | Kim et al. | 438/464 |
| 2004/0103916 A1 | * | 6/2004 | Davis et al. | 134/6 |
| 2004/0134516 A1 | * | 7/2004 | Fulton et al. | 134/6 |
| 2005/0126589 A1 | * | 6/2005 | Horie et al. | 134/6 |
| 2006/0260648 A1 | * | 11/2006 | Lin et al. | 134/6 |
| 2008/0023028 A1 | * | 1/2008 | Fujita | 134/1.1 |
| 2009/0070946 A1 | * | 3/2009 | Tamada et al. | 15/21.1 |

(Continued)

FOREIGN PATENT DOCUMENTS

| | | | | |
|---|---|---|---|---|
| JP | 01321072 A | * | 12/1989 | B23K 3/00 |
| JP | 4-159734 | | 6/1992 | |

(Continued)

*Primary Examiner* — Kiley Stoner
(74) *Attorney, Agent, or Firm* — Ostrolenk Faber LLP

(57) ABSTRACT

A die bonder comprises a movable bond collet for holding an electronic device, and a platform which comprises a cleaning surface for cleaning the bond collet when the bond collet contacts the cleaning surface. The die bonder also comprises a cleaning agent supply, wherein the cleaning agent supply is operative to provide a cleaning agent to the cleaning surface to facilitate the cleaning of the bond collet.

16 Claims, 3 Drawing Sheets

(56) References Cited

U.S. PATENT DOCUMENTS

| | | | |
|---|---|---|---|
| 2011/0127316 A1* | 6/2011 | Dunlop et al. | 228/176 |
| 2012/0067369 A1* | 3/2012 | Currell et al. | 134/6 |
| 2013/0056025 A1* | 3/2013 | Widhalm | 134/6 |
| 2013/0341377 A1* | 12/2013 | Cheng et al. | 228/4.5 |
| 2014/0034712 A1* | 2/2014 | Maeda et al. | 228/160 |
| 2014/0251535 A1* | 9/2014 | Ishii et al. | 156/281 |
| 2015/0192601 A1* | 7/2015 | Cohen | |

FOREIGN PATENT DOCUMENTS

| | | | | |
|---|---|---|---|---|
| JP | 2004134603 A | * | 4/2004 | H01L 21/60 |
| KR | 2002-0039571 | | 5/2002 | |

* cited by examiner

DIE BONDER AND A METHOD OF CLEANING A BOND COLLET

CROSS-REFERENCE

The present application claims the benefit of the Provisional Application No. 61/921,178 filed Dec. 27, 2013, entitled "A DIE BONDER HAVING A CLEANING DEVICE FOR CLEANING A BOND COLLET".

BACKGROUND

The invention relates to the maintenance of bond collets during semiconductor die bonder production runs, and in particular to the cleaning of the bond collets.

Typically, a wafer comprising a plurality of semiconductor dice are mounted on an adhesive film during singulation wherein each individual die is separated while adhering to the adhesive film. Detaching and picking up of a die from the adhesive film is thus commonly involved in die bonding and flip chip bonding processes for assembling an electronic package.

In a flip chip process, dice are picked up by a flip arm at the back sides of the dice and then transferred to a bond head comprising a bond collet, so that the bond collet picks the dice from the bump side of the dice. As the bump dice are mounted on a wafer film from the bump side, there are often adhesive residues on the bump surface after detaching the dice from the adhesive film. Since the bond collet directly contacts the bump side of the dice during die transfer to the bond head, adhesive residues will eventually transfer and accumulate on the bond collet surface, affecting bonding quality. Also, an unclean bond collet surface may damage the die surface.

Typically, in a flip chip assembly process, the bond collet is cleaned as a manual offline process at fixed intervals. Most commonly, the bond collets are cleaned by a solvent and a clean room cloth by machine operators. The cleanliness is visually judged by the operators. During bond collet cleaning, the machine has to be stopped and this frequency can reach up to five times per hour, which affects the utilization of the machine and decreases productivity. Therefore, it is desirable to shorten the cleaning time.

Examples of prior art for bond collet cleaning application in a die bonder are highlighted as follows. Korean patent KR 20020039571A entitled "System and method for cleaning bond collet" discloses a system that cleans a bond collet by a blower and a brush. In the cleaning system, the bond collet is transferred to a position above a working table by a transferring arm. The working table supports a remover, such as a brush, for cleaning the bond collet. The transferring arm then rubs the bond collet on the remover with air blowing out of the bond collet to remove the chip residues, with controller control. The disadvantage of this method is that the air blown may blow particles to the bond area, and damage to the bond collet tip may be caused by rubbing against the stiff bristles of the brush.

Japanese patent JP 04-159734A entitled "Collet cleaning method and die bonder" discloses a bond collet cleaning setup in a die bonder which cleans a bond collet during every die-bonding operation. This published patent application discloses two setups. In the first setup, a motor driven rotary cleaning block with eight spiral blades is placed in between a wafer ring and a lead frame. The collet picks up a die from the wafer and places the die on lead frame islands. After that it moves to the cleaning block position and let the spiral blades remove the residue. A new bonding cycle begins after the cleaning process. The second setup is a cheaper version of the first setup, in that the rotary cleaning block is replaced by a fixed cleaning block. Again, this method might also generate contaminants to the bond area and cause bond collet damage.

SUMMARY

According to a first aspect of the present invention, there is provided a die bonder comprising: a movable bond collet for holding an electronic device; a platform comprising a cleaning surface for cleaning the bond collet when the bond collet contacts the cleaning surface; and a cleaning agent supply; wherein the cleaning agent supply is operative to provide a cleaning agent to the cleaning surface to facilitate the cleaning of the bond collet.

Optionally, the cleaning surface comprises a textile material.

Optionally, the textile material comprises a clean room cloth.

Optionally, the cleaning agent supply is operative to provide further cleaning agent to the cleaning surface each time the bond collet contacts the platform.

Optionally, the platform is movable between a first position and a second position.

Optionally, the die bonder further comprises a biasing mechanism configured to bias the platform towards the first position.

Optionally, the biasing mechanism comprises a resilient element.

Optionally, the biasing mechanism comprises a spring.

Optionally, the cleaning agent supply is operative to provide further cleaning agent to the cleaning surface each time the bond collet moves the platform away from the first position.

Optionally, the die bonder further comprises a pump for pumping the cleaning agent from the cleaning agent supply so as to provide the cleaning agent to the cleaning surface.

Optionally, the pump is an antistatic pump.

Optionally, the cleaning agent supply comprises a container on which the platform is mounted.

Optionally, the platform further comprises a resilient material on which the cleaning surface is arranged, so as to reduce impact on the bond collet when the bond collet contacts the cleaning surface.

Optionally, the resilient material is a rubber sheet.

Optionally, the die bonder further comprises a camera adjacent to which the bond collet is positionable for inspecting the bond collet after the bond collet has been cleaned on the cleaning surface.

According to a second aspect of the present invention, there is provided a method of cleaning a bond collet of a die bonder which is configured for holding an electronic device, the method comprising the steps of: providing a cleaning agent to a cleaning surface comprised in a platform from a cleaning agent supply; contacting the bond collet on the cleaning surface; and cleaning the bond collet on the cleaning surface.

Optionally, the method further comprises the step of pushing the platform with the bond collet from a first position to a second position when contacting the bond collet on the cleaning surface.

Optionally, the method further comprises the step of dispensing the cleaning agent to the cleaning surface when the platform is pushed away from the first position.

Optionally, the step of dispensing the cleaning agent to the cleaning surface is carried out by a pump.

Optionally, the method further comprises the step of inspecting the bond collet with a camera after cleaning the bond collet.

According to a third aspect of the present invention, there is provided a cleaning module for cleaning a bond collet of a die bonder, the cleaning module comprising a platform comprising: a cleaning surface for cleaning the bond collet when the bond collet contacts the cleaning surface; and a cleaning agent supply; wherein the cleaning agent supply is operative to provide a cleaning agent to the cleaning surface to facilitate the cleaning of the bond collet.

BRIEF DESCRIPTION OF THE DRAWINGS

These and other features, aspects, and advantages will become better understood with regard to the Description section, appended claims, and accompanying drawings.

Embodiments of the present invention will now be described, by way of example only, with reference to the accompanying drawings, in which.

In the drawings, like parts are denoted by like reference numerals.

DESCRIPTION

In the Summary section, in the Description section, in the appended claims, and in the accompanying drawings, reference is made to particular features (including method steps) of the present invention. It is to be understood that the disclosure of the present invention in this specification includes all possible combinations of such particular features. For example, where a particular feature is disclosed in the context of a particular aspect or embodiment of the present invention, or a particular claim, that feature can also be used, to the extent possible, in combination with and/or in the context of other particular aspects and embodiments of the present invention, and in the inventions generally.

Figure 1:
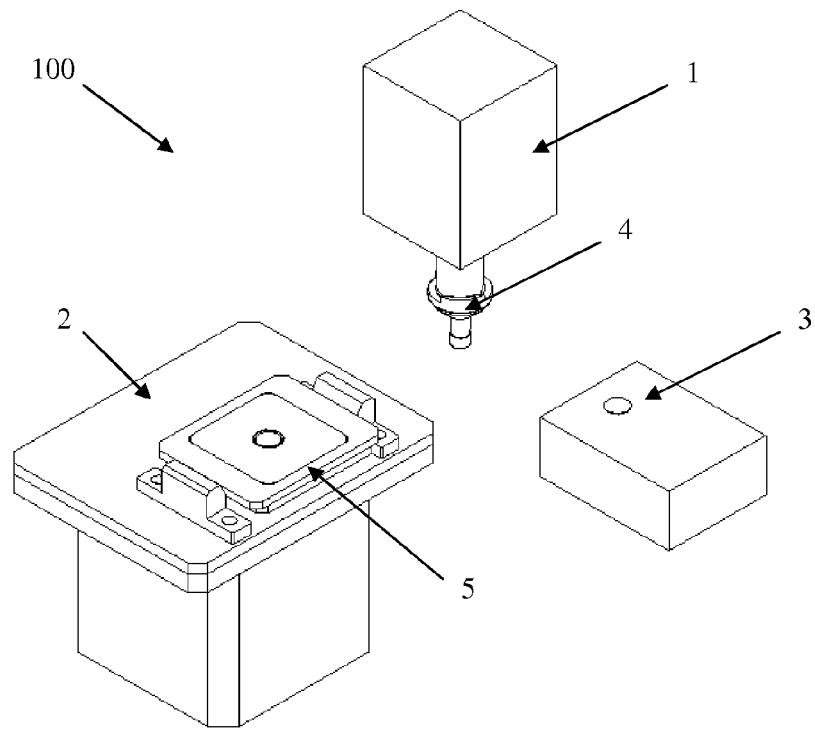
FIG. 1 is an illustration of a die bonder comprising a bond head, a bond collet cleaning module, and an up-look camera.

FIG. 1 is an illustration of a die bonder 100 (eg. a flip chip bonder) comprising a bond head 1, a bond collet cleaning module 2 and an up-look camera 3 according to the preferred embodiment of the invention. A bond collet 4 for holding an electronic device, such as a die, is movable and is directly transferrable by the bond head 1. The bond collet cleaning module 2 comprises a cleaning platform 5 up-down movable to an upper position and a lower position. The cleaning platform 5 size is larger than the largest die size supported by the machine and allows some bond collet 4 movements on the cleaning platform 5 for rubbing motion. The up-look camera 3 stands by for cleanliness inspection.

Figure 2:
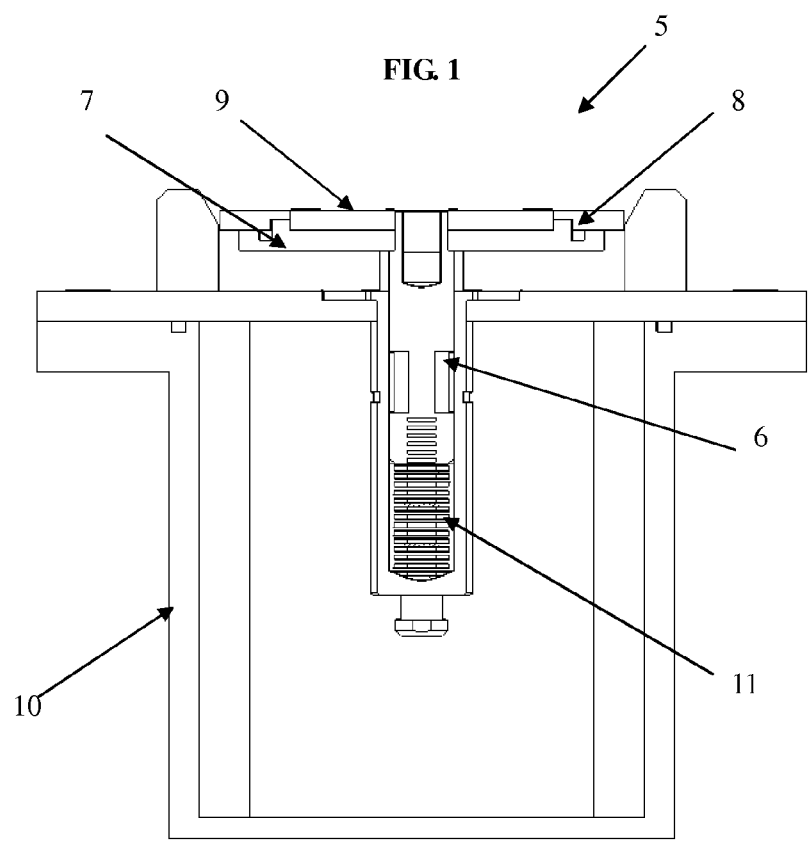
FIG. 2 is an illustration of a cross-section of the bond collet cleaning module.

FIG. 2 is an illustration of a cross-section of the bond collet cleaning module 2. The bond collet cleaning module 2 includes the cleaning platform 5 that comprises an antistatic pump 6, a platform support 7 on which a resilient material such as a piece of rubber sheet 8 and a piece of cloth such as a clean room cloth 9, are mounted, and a cleaning agent container 10 on which the cleaning platform 5 is mounted. The piece of rubber sheet 8, which is located below the clean room cloth 9, acts as a soft bumper to reduce the impact when the bond collet contacts the cleaning platform 5 surface and provides stability to the clean room cloth 9 to improve the rubbing efficiency. The platform support 7 is biased by a biasing mechanism, such as a spring mechanism 11, towards the upper position. The spring mechanism 11, which exerts a biasing force on the cleaning platform 5, keeps the cleaning platform 5 in the upper position during a downward pressing motion by the bond head 1 and ensures that a cleaning surface of the clean room cloth 9 contacts a tip surface of the bond collet 4 during cleaning.

The cleaning agent supply is operative to provide a cleaning agent to the cleaning surface when the bond collet 4 contacts or pushes the cleaning platform 5, to facilitate the cleaning of the bond collet 4. The cleaning agent supply is also operative to provide further cleaning agent to the cleaning surface each time the bond collet 4 contacts the cleaning platform 5. The antistatic pump 6 is activated when the bond collet 4 presses onto or pushes the cleaning platform 5 and compresses the spring mechanism 11. The cleaning agent is pumped out from a cleaning agent container 10 to the cleaning surface each time the bond collet 4 moves the cleaning platform 5 away from the upper position, thereby wetting the clean room cloth 9. The cleaning platform 5 has a range of motion within the range of up to 3 mm, by mechanical design. The volume of cleaning agent dispensed is controlled by the pressing distance of the bond head 1, which is in turn controlled via programming of the die bonder's processor.

Figure 3A:
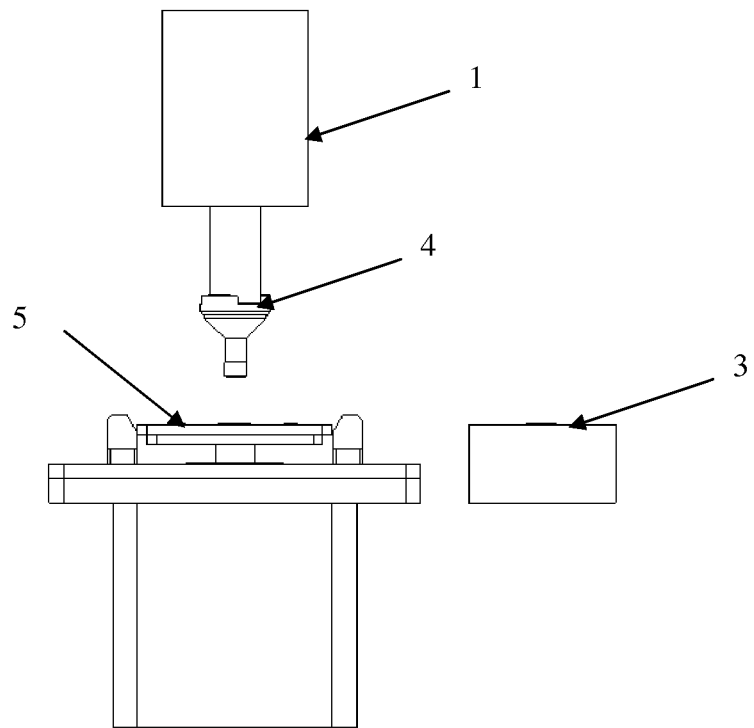
FIG. 3A is a side view of the bond head arranged above the bond collet cleaning module.

FIG. 3A is a side view of the bond head 1 arranged above the bond collet cleaning module 2. This is the standby position of the cleaning process. After the die bonder 100 has run a predetermined number of bonding cycles, the bond head 1 will move to the position directly above the cleaning platform 5 to prepare for the cleaning of the bond collet 4.

Figure 3B:
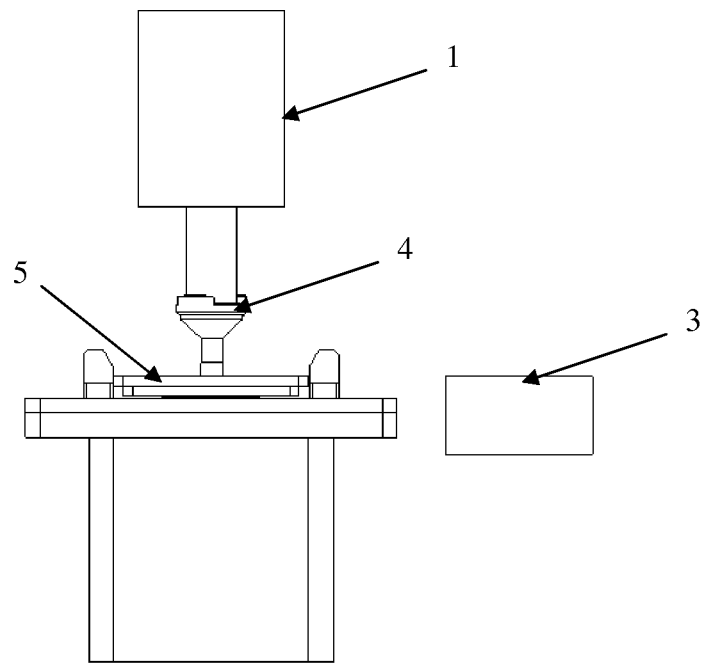
FIG. 3B is a side view of the bond head collet being pressed down onto a cleaning platform.

FIG. 3B is a side view of the bond collet 4 pressing down onto the cleaning platform 5. The downward force exerted by the bond head 1 onto the platform 5 will actuate the antistatic pump 6 to dispense the cleaning agent to the cleaning surface from the container 10 below the cleaning platform 5.

Figure 3C:
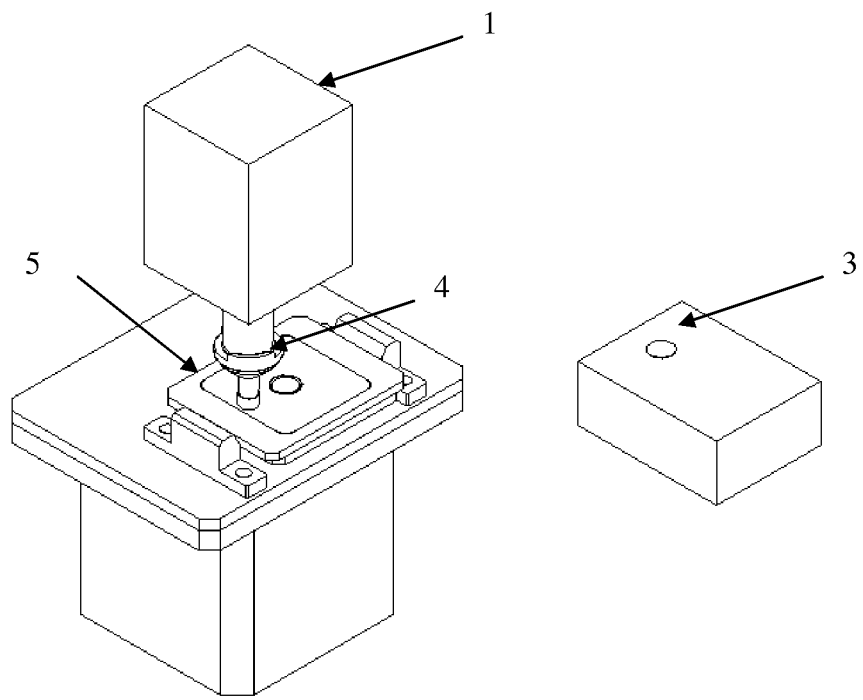
FIG. 3C is an isometric view showing the bond collet rubbing on the cleaning platform.

FIG. 3C is an isometric view showing the bond collet 4 rubbing in a generally sideways motion against the cleaning platform 5. The bond collet 4 is rubbed against the wet clean room cloth 9 by a motion cleaning pattern of the bond head. The bond head motion cleaning pattern is set by the processor depending on the type of bond collet 4 used.

Figure 3D:
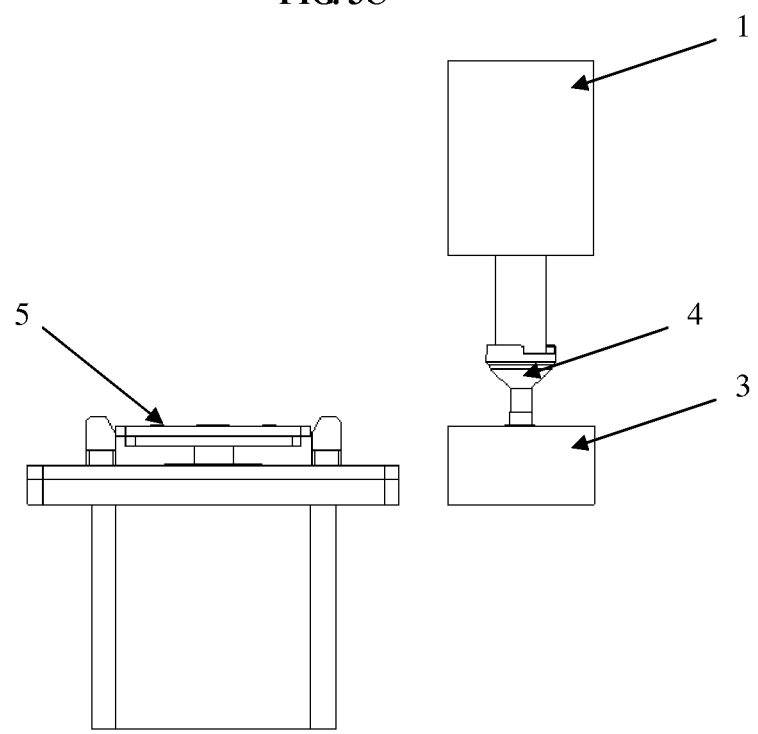
FIG. 3D is a side view of the bond head positioned above the up-look camera for inspection.

FIG. 3D is a side view of the bond head 1 being positioned adjacent or above the up-look camera 3 for inspection. After rubbing the bond collet 4 on the cleaning platform 5, the bond head 1 will move the bond collet 4 to a position above the up-look camera 3 for inspection. If the up-look camera 3 images any abnormal feature on the surface of the bond collet 4, the cleaning process may either repeat itself or the machine may prompt the operator to check the bond collet 4. This would also minimize any damage to the bond collet 4 during production. To reduce the cleaning process time, a motion cleaning pattern of the bond head 1 can be optimized and verified by the up-look inspection process. The cleanliness check may potentially be omitted by setting the motion cleaning of the bond head 1 to the optimum motion cleaning pattern.

Although the present invention has been described in considerable detail with reference to certain embodiments, other embodiments are possible. For example, instead of a clean room cloth 9, the cleaning surface may comprise any other textile material, a sponge, or another soft and absorbent material. The spring mechanism also may be any resilient material, such as a helical spring or a block of compressible material. The cleaning agent supply may supply the cleaning agent to the cleaning surface through various other ways, for example by capillary action through a channel or other medium. The cleaning agent supply may or may not need to be positively activated to supply the cleaning agent to the cleaning surface. Where the cleaning agent supply needs to be positively activated, various other methods of activation may be employed, for example by sensors or time based activation.

Therefore, the spirit and scope of the appended claims should not be limited to the description of the embodiments contained herein.

What is claimed is:

1. A die bonder, comprising:
   a movable bond collet for holding an electronic device;
   a platform comprising a cleaning surface for cleaning the bond collet when the bond collet contacts the cleaning surface, wherein the platform is movable between a first position and a second position;
   a biasing mechanism configured to bias the platform towards the first position; and
   a cleaning agent supply;
   wherein the cleaning agent supply is operative to provide a cleaning agent to the cleaning surface to facilitate the cleaning of the bond collet.

2. The die bonder of claim 1, wherein the cleaning surface comprises a textile material.

3. The die bonder of claim 2, wherein the textile material comprises a clean room cloth.

4. The die bonder of claim 1, wherein the cleaning agent supply is operative to provide further cleaning agent to the cleaning surface each time the bond collet contacts the platform.

5. The die bonder of claim 1, wherein the biasing mechanism comprises a helical spring.

6. The die bonder of claim 1, wherein the cleaning agent supply is operative to provide further cleaning agent to the cleaning surface each time the bond collet moves the platform away from the first position.

7. The die bonder of claim 1, further comprising a pump for pumping the cleaning agent from the cleaning agent supply so as to provide the cleaning agent to the cleaning surface.

8. The die bonder of claim 7, wherein the pump is an antistatic pump.

9. The die bonder of claim 7, wherein the cleaning agent supply comprises a container on which the platform is mounted.

10. A die bonder, comprising:
    a movable bond collet for holding an electronic device;
    a platform comprising a cleaning surface for cleaning the bond collet when the bond collet contacts the cleaning surface;
    a resilient material on which the cleaning surface is arranged, so as to reduce impact on the bond collet when the bond collet contacts the cleaning surface; and
    a cleaning agent supply;
    wherein the cleaning agent supply is operative to provide a cleaning agent to the cleaning surface to facilitate the cleaning of the bond collet.

11. The die bonder of claim 10, wherein the resilient material is a rubber sheet.

12. The die bonder of claim 1, further comprising a camera adjacent to which the bond collet is positionable for inspecting the bond collet after the bond collet has been cleaned on the cleaning surface.

13. A method of cleaning a bond collet of a die bonder which is configured for holding an electronic device, the method comprising the steps of:
    providing a cleaning agent to a cleaning surface comprised in a platform from a cleaning agent supply;
    contacting the bond collet on the cleaning surface;
    pushing the platform with the bond collet from a first position to a second position when contacting the bond collet on the cleaning surface; and
    cleaning the bond collet on the cleaning surface.

14. The method of claim 13, further comprising the step of dispensing the cleaning agent to the cleaning surface when the platform is pushed away from the first position.

15. The method of claim 13, wherein the step of dispensing the cleaning agent to the cleaning surface is carried out by a pump.

16. The method of claim 13, further comprising the step of inspecting the bond collet with a camera after cleaning the bond collet.

* * * * *